United States Patent [19]
Botti et al.

[11] Patent Number: 5,515,224
[45] Date of Patent: May 7, 1996

[54] LIMITATION OF CURRENT ABSORPTION UNDER SHORT-TO-PLUS UNPOWERED CONDITIONS OF THE OUTPUT NODE OF AN AMPLIFIER

[75] Inventors: Edoardo Botti, Vigevano; Andrea Fassina, Milan; Paolo Ferrari, Gallarate, all of Italy

[73] Assignee: SGS-Thomson Microelectronics S.r.l., Agrate Brianza, Italy

[21] Appl. No.: 192,426

[22] Filed: Feb. 7, 1994

[30] Foreign Application Priority Data

Feb. 24, 1993 [EP] European Pat. Off. .............. 93830071

[51] Int. Cl.$^6$ .................................................. H02H 3/20
[52] U.S. Cl. ............................................ 361/56; 361/91
[58] Field of Search ............................ 361/88–89, 91, 361/98, 18, 56, 58, 54

[56] References Cited

U.S. PATENT DOCUMENTS 5,038,054  8/1991  Peyre Lavigne et al. .............. 307/315

FOREIGN PATENT DOCUMENTS 0332906  11/1989  European Pat. Off. ....... H03K 17/08

Primary Examiner—A. D. Pellinen
Assistant Examiner—Michael J. Sherry
Attorney, Agent, or Firm—David M. Driscoll; James H. Morris

[57] ABSTRACT

A transistor in an output stage has an emitter connected to a supply rail and a collector connected to an output node. The transistor is protected against the effects of accidental short-circuiting of the output node of the output stage with a positive pole of a battery while the circuit is unpowered, by a protection transistor of the same type as the transistor to be protected. The protection transistor has an emitter connected to the base of the output transistor, a collector connected to the output node of the output stage, and a base connected through a biasing resistance to the supply rail on the output stage. The protection transistor and an interdigitated structure of the transistor may be formed within the same pocket, thus reducing the required area.

18 Claims, 3 Drawing Sheets

5,515,224

LIMITATION OF CURRENT ABSORPTION UNDER SHORT-TO-PLUS UNPOWERED CONDITIONS OF THE OUTPUT NODE OF AN AMPLIFIER

BACKGROUND OF THE INVENTION

1. Field of the Invention

The present invention relates to a power amplifier which is to be connected and powered by a DC battery, and which is provided with circuitry for preventing destructive breakdown that may be caused by inadvertently connecting the DC supply to the output terminal of the amplifier while the amplifier is unpowered.

2. Discussion of the Related Art

During the installation of devices having power amplifiers, destructive breakdown events caused by inadvertent erroneous connection of the device to a local DC supply are frequent. The most typical instance is in the installation of audio amplifiers, radio receivers, and cassette and CD players on vehicles.

The output terminals of power amplifiers are normally provided with some sort of protection against accidental shortcircuits that may inadvertently occur to ground potential or to the DC supply voltage. However, there are still instances of failures on the field for which specific protection has not yet been devised.

Among these remaining accidental causes of failure there is a condition commonly known as "short-to-plus-unpowered" (SPU). Such a condition, which may occur during the installation of an apparatus on a vehicle, is schematically depicted in FIG. 1. An SPU error is caused by an inadvertent connection of the output terminal (Out) of the amplifier (Amp), to the positive pole of the battery ($V_{batt}$) of the vehicle, instead of correctly connecting the supply terminal (Vcc) to the positive pole of the battery ($V_{batt}$). This error may occur when the isolated cable coming from the positive pole of the vehicle's battery is erroneously connected to the output terminal of the card that contains the amplifier. In practice, the output terminal (Out) of the amplifier becomes connected to ground through a filter capacitor C1, typically about a thousands microfarads, that is typically and through an equivalent resistance, typically in the order of 10 ohms, toward ground R1 of the rest of the circuit on the card.

When the output terminal (Out) of the circuit is accidentally connected to the positive node ($V_{batt}$) of the local battery (e.g. of the vehicle), the circuit is "powered" through its output node. Current flows toward ground both through the ground terminal (Gnd) of the amplifier, as well as through the supply terminal (Vcc) and the equivalent network formed by R1 and C1, the latter being charged by the current flowing through the Vcc terminal of the amplifier.

Commonly, the output stage of a power amplifier has a push-pull configuration and includes a pair of complementary transistors, such as an NPN and a PNP transistor, having their respective collectors connected to the output node of the amplifier (Out). An equivalent circuit, under an SPU condition, is depicted in FIG. 2. In other instances, the output stage of the amplifier may have a bridge configuration and may be formed by transistors of the same type.

In all cases, power transistor Q1 is functionally connected between the supply rail and the output node of the stage, and, as depicted in the figure, may include a PNP transistor, such as a vertical, isolated collector, PNP transistor (ICVPNP) having an emitter connected to the supply line Vcc of the amplifier. Transistor Q1 functions in a reverse bias active region, where the collector terminal acts as the emitter (E), the base terminal (B) as a base and the emitter terminal as a collector (C).

As in any transistors, also in a reverse bias configuration, the voltage between the "base" and the "collector" should not become greater than a maximum value (dependant on the fabrication technology) in order to avoid breakdown of the junction with an attendant risk of a destructive breakdown because of an excessive power dissipation.

For many fabrication processes, the maximum voltage that can be tolerated between emitter (E) and collector nodes, under reverse bias conditions, is less than the battery voltage ($V_{batt}$). This makes an SPU condition particularly critical, especially immediately after the occurrence of an accidental short circuit, when the capacitor C1 is discharged and the voltage between the "base" and the "collector" assumes a maximum value that is equal to about $V_{batt}$-0.7 V.

It is evident that there is a need and for a device capable of preventing failure of the transistor Q1 under SPU conditions. No solutions to this problem are currently known.

SUMMARY OF THE INVENTION

The present invention provides protection for the power transistor of an output stage that is functionally connected between the output node and the supply rail, when a supply voltage is inadvertently applied to the output terminal of the amplifier while the circuit is unpowered.

According to the present invention, the base-emitter junction of the transistor is shortcircuited, under reverse bias conditions, when an SPU condition occurs. A switch is coupled between the base and collector of the transistor to be protected. The switch couples the base and collector in response to an SPU condition.

The switch preferably has a protection transistor with an emitter coupled to the base of the transistor to be protected and a base connected in parallel to shortcircuit the junction and has a control terminal connected, through a biasing resistance, to the supply rail of the amplifier.

When an SPU condition is not detected and a power supply is connected to the supply rail, the protection transistor does not conduct current, and thus current flows through the first transistor unimpeded.

In a preferred embodiment, the first transistor is a vertical PNP transistor having a collector with an interdigitated structure, and the protection transistor is a PNP transistor formed in the same pocket.

BRIEF DESCRIPTION OF THE DRAWINGS

The different aspects and advantages of the present invention will become clearer through the following description of several important embodiments and by referring to the attached drawings, wherein.

3

Figure 4:
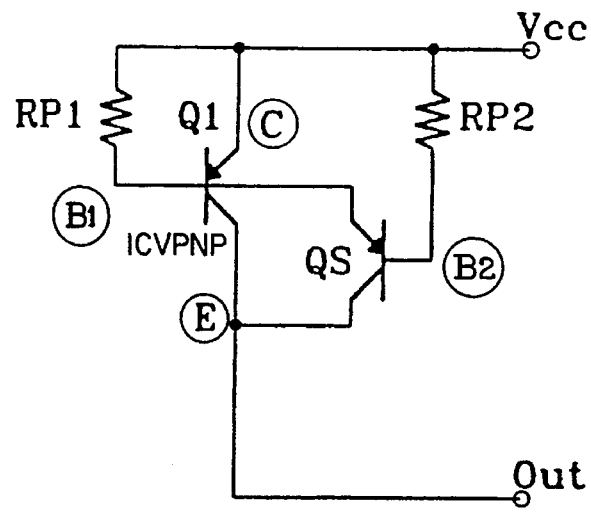
FIG. 4 is a schematic of an embodiment of the protection device.
Figure 5:
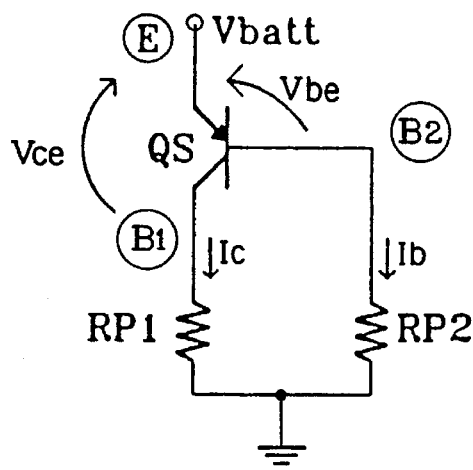

FIG. 5 is a functional diagram of the protection device of FIG. 4; and

Figure 6:
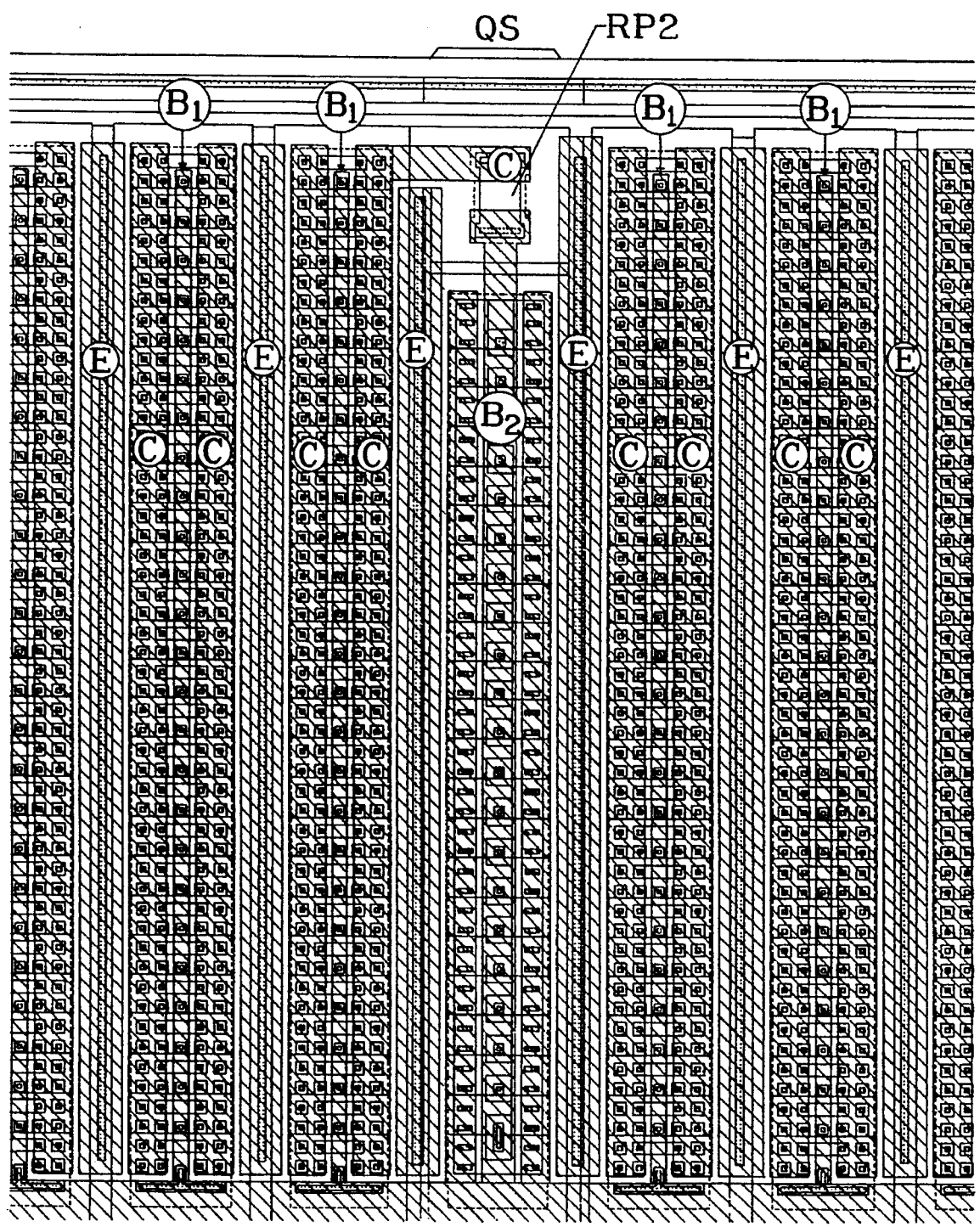

FIG. 6 is a layout of an interdigitated integrated structure of a power transistor, with which an additional SPU protection transistor is formed.

In all the figures, a reverse bias condition of operation of transistors, in an SPU condition, is schematically depicted by the use of letter labels (B), (E), and (C) that identify the virtual base node (B), emitter node (E), and collector node (C), respectively, of the transistor structure subject to reverse bias. By contrast, the functional structure is represented by the conventional graphic symbol of the particular type of transistor.

DETAILED DESCRIPTION

Figure 1:
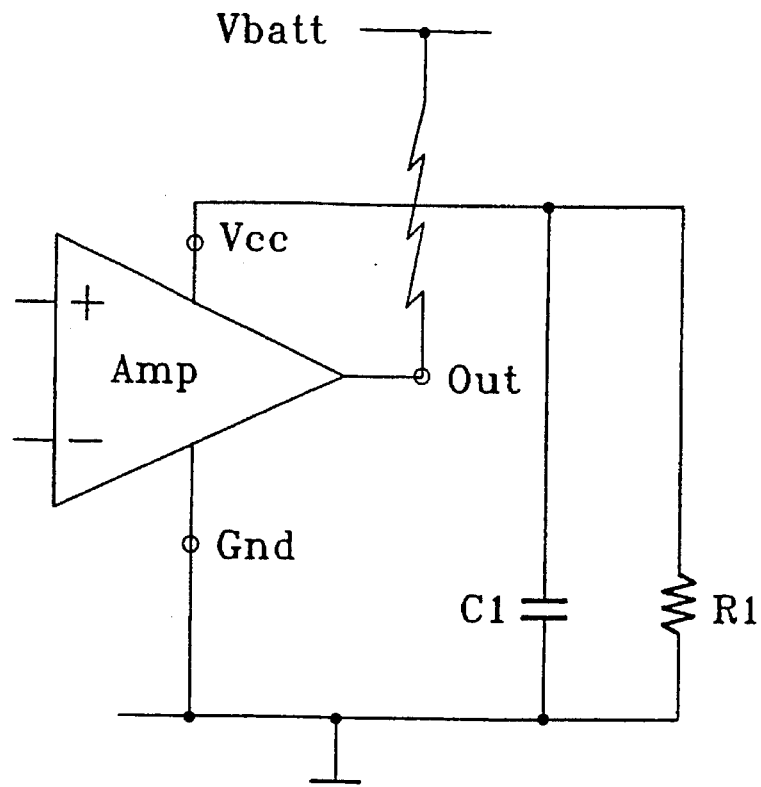
FIG. 1 is an electrical schematic of an accidental SPU condition.
Figure 2:
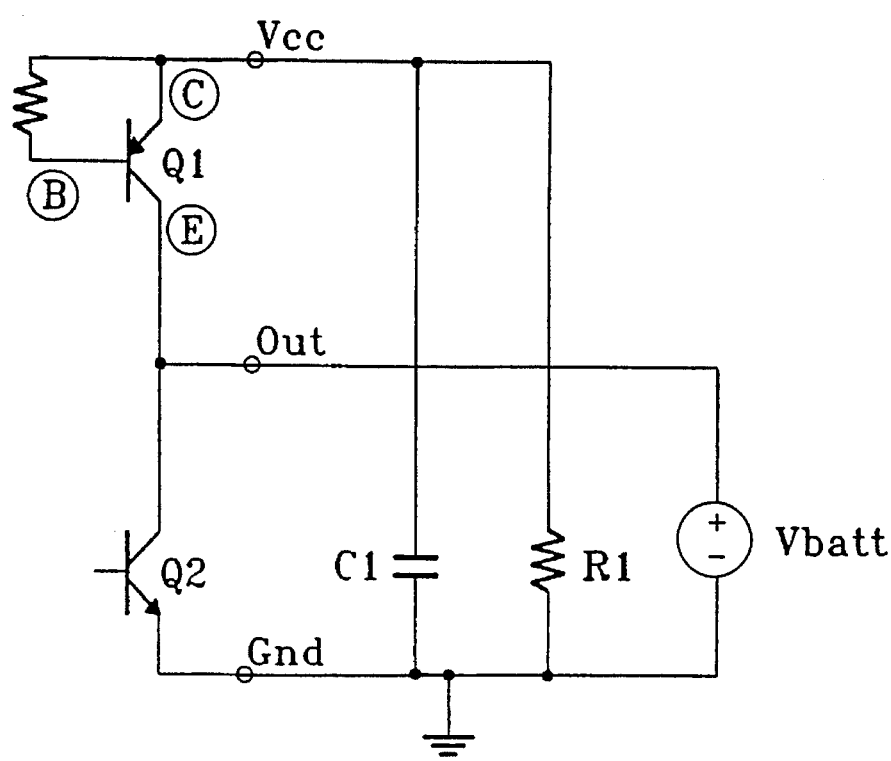
FIG. 2 is a schematic of an output stage of an amplifier that is more subject to a destructive breakdown as a consequence of the occurrence of an SPU condition.
Figure 3:
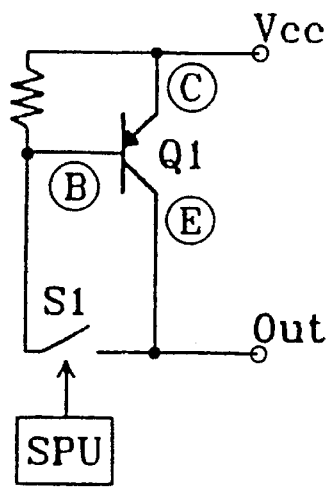
FIG. 3 is a partial diagram of the component of the output stage of FIG. 2 that is subject to a possible breakdown, and a protection device according to the present invention.

The problem of a reverse bias condition of the output power transistor Q1, connected to the supply rail of an output stage under an SPU condition, as depicted in FIGS. 1 and 2, may be substantially reduced or eliminated by shortcircuiting through a protection switch S1 the virtual base-emitter (B)/(E) junction of the transistor. Protecting switch S1 may be switched by a sensor which can detect the occurrence of an SPU condition due to an erroneous connection to the output node (Out) of the amplifier of the supply battery voltage, when the circuit is unpowered.

An embodiment for detecting an SPU condition and for a shortcircuiting the (B)/(E) junction of the transistor at risk is depicted in FIG. 4. The protection device, according to this embodiment, includes a transistor QS having an emitter connected to the base (B1) of the power transistor Q1, a collector connected to the output node (Out), and a base (B2) connected, through a biasing resistance RP2, to the supply rail Vcc of the amplifier circuit.

During normal functioning of the circuit, the protection transistor QS, which is substantially the same as the power transistor Q1 to be protected, is OFF, because the potential on the base (node B2) is higher than the potentials on the emitter and the collector nodes. In fact, the base potential is substantially equal to supply voltage Vcc of the amplifier.

In case of an SPU event, e.g., in absence of power (Vcc=0) and in presence of an accidental connection of the output terminal (Out) of the amplifier to the supply voltage ($V_{batt}$), protection transistor QS functions in a reverse saturation zone and therefore node (E) becomes an emitter node, node B2 constitutes the base node, and node (B1) becomes a collector node of the protection transistor QS. Because the potential on the node (B2) is lower than the potential on the node (E), the protection transistor QS turns ON, thus effectively shortcircuiting nodes (E) and (B1).

For correct operation of the protection circuit, the ratio between biasing resistances RP2 and RP1 and the saturation resistance (Rsat) of the protection transistor QS should be selected so that the voltage between nodes (E) and (B1) is insufficient to cause reverse biased transistor Q1 to conduct. Therefore, protection transistor QS should saturate with a relatively low voltage between its collector and its emitter, taking into consideration the collector load RP1.

Since the protection device of the present invention is primarily, though not exclusively, devised for monolithically integrated amplifiers, certain considerations will be better understood with reference to FIG. 5. The maximum current that the protection transistor QS must conduct is approximately given by the following equation: $IC=V_{batt}/RP1$. If RP1 has a relatively low value, current IC may be relatively high. For example, in the case of a battery voltage:

4

$V_{batt,max}=18$ V and RP1=150 ohms, so the current $I_{C,max}$ may be about 120 mA. This poses a limit to the maximum value of the saturation resistance that the protection transistor QS may have.

Should a lateral type integrated transistor be unable to provide a sufficiently low saturation resistance, the protection transistor QS may be implemented in the form of a vertical transistor with isolated collector, e.g. an ICVPNP, as the power transistor Q1 in the example shown. If, as is probable, the design dimensions of the protection transistor QS are relatively large, the protection device, including transistor RP2, may be integrated within the same "pocket" that contains the integrated structure of the power transistor Q1, thus saving semiconductor area.

FIG. 6 depicts as integrated embodiment of the protection device according to the present invention. The protection transistor QS is made in the form of an "additional finger" purposely formed among the fingers of the interdigitated structure of the power transistor Q1. The structure of the protection transistor QS may be substantially similar to the structure of the other fingers belonging to the integrated structure of the power transistor Q1 except for the following:

a) because the collector QS (node (E) in FIG. 4) is in common with the collector of the power transistor Q1, the collector structure of the latter may be used also as the collector of the additional structure of the protection transistor QS;

b) the emitter of protection transistor QS (node (B1) of FIG. 4) may be connected to the base region of the power transistor Q1 through a metal path; and c) biasing resistance RP2 may be formed by forming a p-type diffusion in an n-type base region of the power transistor Q1, which will represent the "pocket" region of the integrated resistance.

This arrangement is possible because node (B1) of FIG. 4 under SPU conditions is at a higher voltage than the integrated "body" of the RP2 resistance, and therefore the resistance is correctly biased. Under normal operation conditions, the maximum voltage of the p-type diffusion constituting the RP2 resistance is equivalent to supply voltage Vcc and therefore is higher than the voltage of the n-type region into which it is formed. The normal functioning of the power transistor Q1 is not jeopardized, because such a p-diffusion (constituting the biasing resistance RP2) behaves as a supplementary "emitter" (relatively of small size) for the transistor Q1. One terminal of RP2 is connected to the base region of the protection transistor QS (node B2,) while the other terminal is connected to the supply metal (node C) that is close by because it is connected to the emitter region of the integrated structure of the power transistor Q1.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the folowing claims and the equivalents thereto.

What is claimed is:

1. A protection circuit for protecting an output stage against a short-to-plus unpowered (SPU) condition at an output node of the output stage, the output stage having a first transistor with a base, an emitter connected to a supply rail, and a collector connected to the output node, the protection circuit comprising:

a switch, coupled between the base and the collector of the transistor, that detects an SPU condition at the output node, and provides substantially a short circuit between the base and the collector in response to the detection of the SPU condition to prevent the transistor from turning to an on state in which electric charge flows through the first transistor.

2. The protection circuit of claim 1 wherein the circuit includes a second transistor comprising:

an emitter coupled to the base of the first transistor, a collector coupled to the output node, and a base coupled through a first resistance to the supply rail.

3. The circuit of claim 2, wherein the first transistor and the second transistor are both PNP transistors.

4. The circuit of claim 2 further comprising a second resistance coupled between the supply rail and the base of the first transistor.

5. The circuit of claim 4, wherein the second transistor saturates at a voltage lower than a voltage at which the first transistor conducts.

6. The circuit of claim 2, wherein the second transistor does not conduct current when a power supply is coupled to the supply rail.

7. A circuit comprising:

a first transistor having a base, an emitter coupled to a supply rail, and a collector coupled to an output node;

a second transistor having an emitter connected to the base of the first transistor, a collector connected to the output node, and a base;

a first resistance having first and second ends, the first end being connected to the base of the second transistor, and the second end being connected to the supply rail; and a second resistance having first and second ends, the first end being connected to the base of the first transistor, and the second end being connected to the supply rail.

8. The circuit of claim 7, wherein the first transistor is a vertical PNP transistor with an isolated collector having an interdigitated structure in an isolated pocket of an integrated circuit.

9. The circuit of claim 8 wherein the second transistor is a PNP transistor formed within the isolated pocket.

10. The circuit of claim 9 wherein the first and second transistors share a common collector.

11. The circuit of claim 9 wherein the emitter of the second transistor is connected to the base of the first transistor through a metal path.

12. The circuit of claim 9 wherein the second resistance includes a p-type diffusion in an n-type base region of the first transistor.

13. The circuit of claim 8, wherein the first resistance is integrated in the form of a diffused region and is contained within a base region of the interdigitated structure of the first PNP transistor.

14. The circuit of claim 7 wherein the first and second transistors are formed so that if a power source having a positive voltage with respect to the supply rail, is connected to the output node, the emitter and base of the first transistor are shorted, and if a power source, having a positive voltage with respect to the output node, is connected to the supply rail, the second transistor does not conduct current from the supply rail.

15. The circuit of claim 9 wherein the second transistor is formed as an additional finger of the interdigitated structure of the first transistor.

16. A method for protecting a transistor of an output stage having an output node from a shortcircuiting of the output node to a power source, the transistor having a collector coupled to the output node, and a base, the method comprising steps of:

coupling a power source to the output node;

detecting the coupling of the output node with the power source; and providing substantially a short circuit between the base of the transistor and the output node to turn the transistor off to prevent current through the transistor.

17. A protection circuit for protecting an output stage against a short-to-plus unpowered (SPU) condition, the output stage having a first transistor with a base, an emitter connected to a supply rail, and a collector connected to an output node, the protection circuit comprising:

means for detecting an SPU condition; and means for turning the first transistor to an off state when an SPU condition is detected to prevent current through the emitter of the first transistor.

18. The circuit of claim 17, wherein the means for turning the first transistor to an off state is disabled when a power supply is coupled to the supply rail.

* * * * *